United States Patent
Le et al.

(10) Patent No.: US 9,153,258 B2
(45) Date of Patent: Oct. 6, 2015

(54) SCISSOR MAGNETIC READ SENSOR WITH NOVEL MULTI-LAYER BIAS STRUCTURE FOR UNIFORM FREE LAYER BIASING

(71) Applicant: HGST Netherlands B.V., Amsterdam (NL)

(72) Inventors: Quang Le, San Jose, CA (US); David J. Seagle, Morgan Hill, CA (US); Neil Smith, San Jose, CA (US); Petrus A. Van Der Heijden, Cupertino, CA (US)

(73) Assignee: HGST Netherlands B.V., Amsterdam (NL)

( * ) Notice: Subject to any disclaimer, the term of this patent is extended or adjusted under 35 U.S.C. 154(b) by 0 days.

(21) Appl. No.: 14/095,932

(22) Filed: Dec. 3, 2013

(65) Prior Publication Data
US 2015/0154991 A1 Jun. 4, 2015

(51) Int. Cl.
G11B 5/39 (2006.01)
G11B 5/596 (2006.01)

(52) U.S. Cl.
CPC ............ G11B 5/3906 (2013.01); G11B 5/3932 (2013.01); G11B 5/59683 (2013.01); *G11B 5/3909* (2013.01); *G11B 2005/3996* (2013.01)

(58) Field of Classification Search
CPC ...... G11B 5/39; G11B 5/3903; G11B 5/3906; G11B 5/3909; G11B 5/3932
USPC ............. 360/324.1, 324.11, 324.12, 324.2, 360/327.2, 327.22, 327.23, 327.3, 327.31
See application file for complete search history.

(56) References Cited

U.S. PATENT DOCUMENTS

| | | | |
|---|---|---|---|
| 5,576,914 A | 11/1996 | Rottmayer et al. | |
| 5,784,224 A | 7/1998 | Rottmayer et al. | |
| 6,266,218 B1 * | 7/2001 | Carey et al. | 360/324.12 |
| 6,667,862 B2 * | 12/2003 | Zhu | 360/324.12 |
| 7,035,062 B1 * | 4/2006 | Mao et al. | 360/324.2 |
| 8,015,694 B2 | 9/2011 | Carey et al. | |
| 8,018,691 B2 | 9/2011 | Gill et al. | |
| 8,149,548 B2 * | 4/2012 | Hatatani et al. | 360/324.12 |
| 8,233,247 B2 | 7/2012 | Carey et al. | |
| 8,400,738 B2 * | 3/2013 | Covington et al. | 360/324.12 |
| 8,582,250 B2 * | 11/2013 | Qiu et al. | 360/324.12 |
| 8,760,822 B1 * | 6/2014 | Li et al. | 360/324.11 |
| 2003/0123198 A1 * | 7/2003 | Sugawara et al. | 360/314 |
| 2004/0207959 A1 * | 10/2004 | Saito | 360/324.1 |
| 2005/0180064 A1 * | 8/2005 | Cyrille et al. | 360/327.3 |
| 2006/0132989 A1 * | 6/2006 | Zhang et al. | 360/324.12 |
| 2011/0026169 A1 | 2/2011 | Gill et al. | |
| 2013/0082696 A1 | 4/2013 | Le et al. | |
| 2014/0340793 A1 * | 11/2014 | Song et al. | 360/319 |

OTHER PUBLICATIONS

Zhu, J.G., "New heights for hard disk drives," Materials Today, Jul./Aug. 2003, pp. 22-31.

* cited by examiner

*Primary Examiner* — Jefferson Evans
(74) *Attorney, Agent, or Firm* — Zilka-Kotab, PC

(57) ABSTRACT

A scissor type magnetic sensor having a back edge bias structure that has a non-uniform magnetic moment to compensate for differences in magnetic spacing between the bias structure and a first magnetic free layer as compared with the magnetic spacing between the bias structure and a second magnetic free layer. The magnetic bias structure can include a first magnetic layer and a second magnetic layer formed over the first magnetic layer, with the first magnetic layer having a higher magnetic moment than the second magnetic layer.

14 Claims, 15 Drawing Sheets

SCISSOR MAGNETIC READ SENSOR WITH NOVEL MULTI-LAYER BIAS STRUCTURE FOR UNIFORM FREE LAYER BIASING

FIELD OF THE INVENTION

The present invention relates to magnetic data recording and more particularly to a scissor type magnetic sensor having a multi-layer back edge bias structure for providing uniform biasing to both free layers of a scissor type magnetic sensor.

BACKGROUND

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating, but when the disk rotates air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes at least one coil, a write pole and one or more return poles. When a current flows through the coil, a resulting magnetic field causes a magnetic flux to flow through the write pole, which results in a magnetic write field emitting from the tip of the write pole. This magnetic field is sufficiently strong that it locally magnetizes a portion of the adjacent magnetic disk, thereby recording a bit of data. The write field, then, travels through a magnetically soft underlayer of the magnetic medium to return to the return pole of the write head.

A magnetoresistive sensor such as a Giant Magnetoresistive (GMR) sensor or a Tunnel Junction Magnetoresisive (TMR) sensor can be employed to read a magnetic signal from the magnetic media. The magnetoresistive sensor has an electrical resistance that changes in response to an external magnetic field. This change in electrical resistance can be detected by processing circuitry in order to read magnetic data from the adjacent magnetic media.

As the need for data density increases there is an ever present need to decrease the size of a magnetic read sensor. With regard to linear data density along a data track, this means reducing the gap thickness of a magnetic sensor. Currently used sensors, such as the GMR and TMR sensors discussed above, typically require 4 magnetic layers, 3 ferromagnetic (FM) and 1 antiferromagnetic (AFM) layer, along with additional nonmagnetic layers. Only one of the magnetic layers serves as the active (or free) sensing layer. The remaining "pinning" layers, while necessary, nonetheless consume a large amount of gap thickness. One way to overcome this is to construct a sensor as a "scissor" sensor that uses only two magnetic "free" layers without additional pinning layers, thus potentially reducing gap thickness to a significant degree. However, the use of such a magnetic sensor results in design and manufacturing challenges, such as the challenge of providing uniform biasing to both free layers of the magnetic sensor.

SUMMARY

The present invention provides a magnetic sensor that includes a sensor stack, and a magnetic bias structure formed adjacent to the sensor stack, the bias structure having a magnetic moment that varies with location within the bias structure.

The magnetic bias structure can include a first magnetic layer and a second magnetic layer formed over the first magnetic layer, the first magnetic layer having a higher magnetic moment than the second magnetic layer. Alternatively, the magnetic bias structure can include more than two magnetic layers of differing magnetic moments. The magnetic bias structure could also be formed as magnetic layer having a gradient magnetic moment, such as with a higher magnetic moment at its bottom and a lower magnetic moment at its top, and wherein the magnet moment gradually varies between the bottom and top surfaces.

This unique magnetic bias structure can be especially advantageous for use as a back edge magnetic bias structure in a scissor type magnetic sensor. In the formation of such sensors, the lower magnetic free layer tends to be less responsive to magnetic biasing than the upper magnetic free layer. This can be as a result of increased stripe height of the bottom free layer as compared with the upper free layer and also as a result of non-uniform thickness of the non-magnetic, electrically insulating layer formed between the sensor stack and the magnetic bias structure. The unique magnetic bias structure compensates for this to provide an equal effective magnetic biasing for both the first and second magnetic free layers, thereby improving performance of the sensor.

These and other features and advantages of the invention will be apparent upon reading of the following detailed description of preferred embodiments taken in conjunction with the figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

DETAILED DESCRIPTION

The following description is of the best embodiments presently contemplated for carrying out this invention. This description is made for the purpose of illustrating the general principles of this invention and is not meant to limit the inventive concepts claimed herein.

Figure 1:
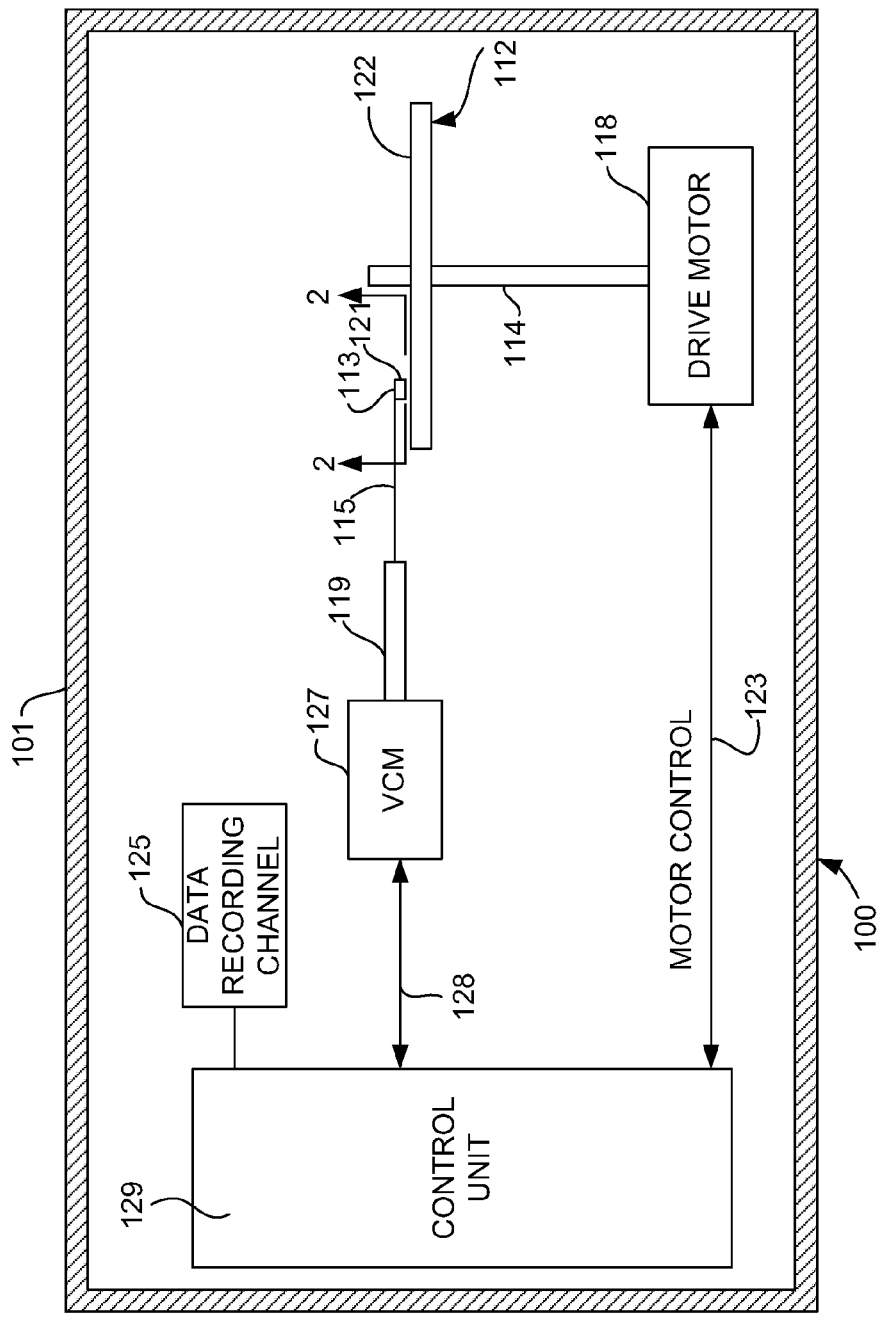
FIG. 1 is a schematic illustration of a disk drive system in which the invention might be embodied.

Referring now to FIG. 1, there is shown a disk drive 100 embodying this invention. The disk drive 100 includes a housing 101. At least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves in and out over the disk surface 122 so that the magnetic head assembly 121 can access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
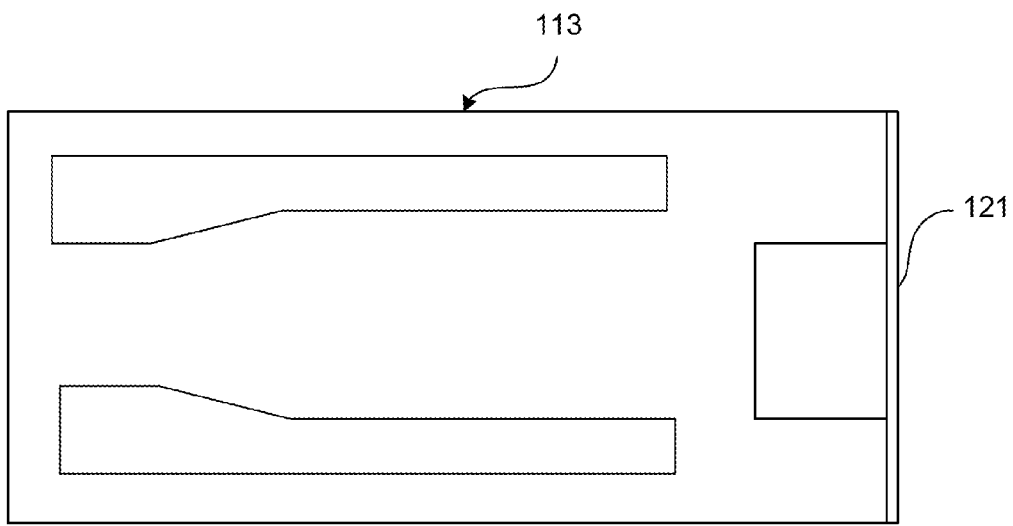
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system and the accompanying illustration of FIG. 1 are for representation purposes only. It should be apparent that disk storage systems may contain a large number of disks and actuators, and each actuator may support a number of sliders.

Figure 3:
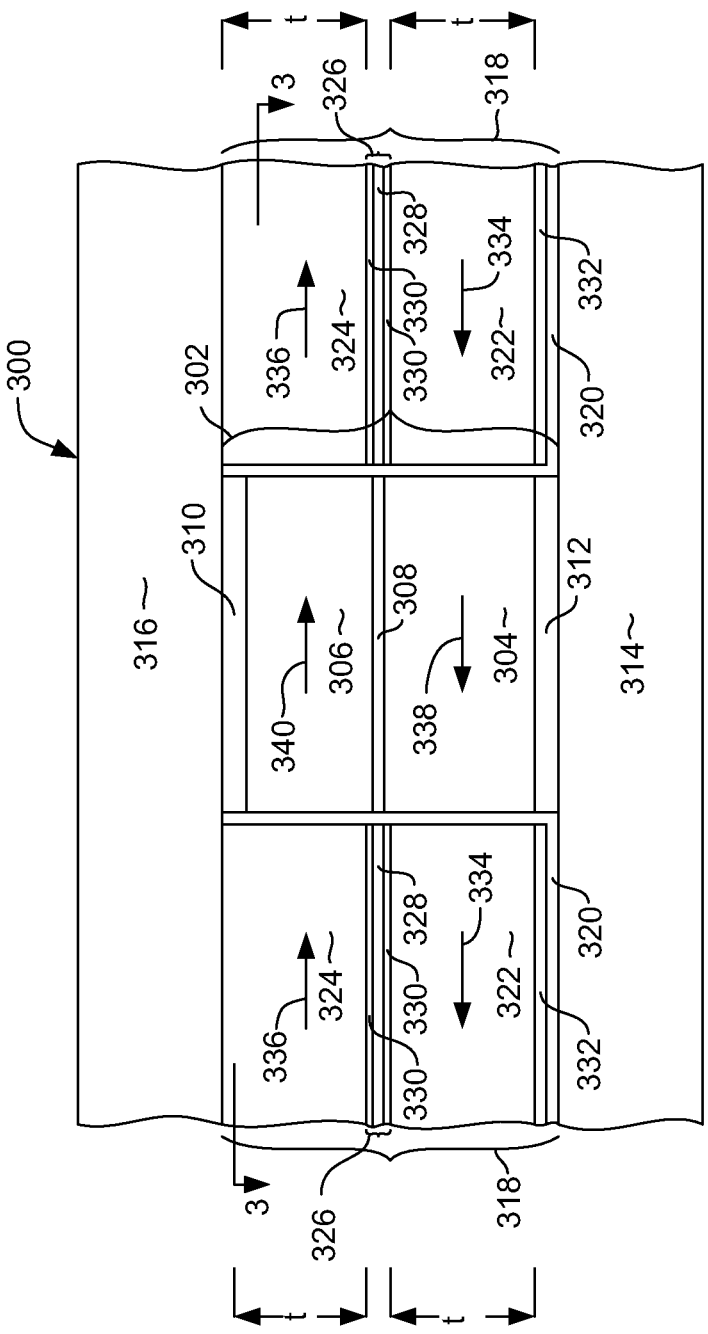
FIG. 3 is an air bearing surface view of a scissor type magnetic read sensor.

FIG. 3 shows a view of a magnetic read head 300 according to a possible embodiment of the invention as viewed from the air bearing surface. The read head 300 is a scissor type magnetoresistive sensor having a sensor stack 302 that includes first and second free layers 304, 306 that are anti-parallel coupled across a non-magnetic layer 308 that can be a non-magnetic, electrically insulating barrier layer such as MgOx or an electrically insulating spacer layer such as AgSn. A capping layer structure 310 can be provided at the top of the sensor stack 302 to protect the layers of the sensor stack during manufacture. The sensor stack 302 can also include a seed layer structure 312 at its bottom to promote a desired grain growth in the above formed layers.

The first and second magnetic layers 304, 306 can be constructed of multiple layers of magnetic material. For example, the first magnetic layer 304 can be constructed of: a layer of Ni—Fe; a layer of Co—Hf deposited over the layer of Ni—Fe; a layer of Co—Fe—B deposited over the layer of Co—Hf; and a layer of Co—Fe deposited over the layer of Co—Fe—B. The second magnetic layer 306 can be constructed of: a layer of Co—Fe; a layer of Co—Fe—B deposited over the layer of Co—Fe; a layer of Co—Hf deposited over the layer of Co—Fe—B; and a layer of Ni—Fe deposited over the layer of Co—Hf. The capping layer structure 310 can also be constructed as a multi-layer structure and can include first and second layers of Ru with a layer of Ta sandwiched there-between. The seed layer structure 312 can include a layer of Ta and a layer of Ru formed over the layer of Ta.

The sensor stack 302 is sandwiched between leading and trailing magnetic shields 314, 316, each of which can be constructed of a magnetic material such as Ni—Fe, of a composition having a high magnetic permeability ($\mu$) to provide effective magnetic shielding.

During operation, a sense current or voltage is applied across the sensor stack 302 in a direction perpendicular to the plane of the layers of the sensor stack 302. The shields 314, 316 can be constructed of an electrically conductive material so that they can function as electrical leads for supplying this sense current or voltage across the sensor stack 302. The electrical resistance across the sensor stack 302 depends upon direction of magnetization of the free magnetic layers 304, 306 relative to one another. The closer the magnetizations of the layer 304, 306 are to being parallel to one another the lower the resistance will be, and, conversely, the closer the magnetizations of the layers 304, 306 are to being anti-parallel to one another the higher the resistance will be. Since the orientations of the magnetizations of the layers 304, 306 are free to move in response to an external magnetic field, this change in magnetization direction and resulting change in electrical resistance can be used to detect a magnetic field such as from an adjacent magnetic media (not shown in FIG. 3). The relative orientations of the magnetizations of the layers 304, 306 will be described in greater detail below with reference to FIG. 4. If the non-magnetic layer 308 is an electrically insulating barrier layer, then the sensor operates based on the spin dependent tunneling effect of electrons tunneling through the barrier layer 308. If the layer 308 is an electrically conductive spacer layer, then the change in resistance results from spin dependent scattering phenomenon.

With continued reference to FIG. 3, the sensor 300 also includes anti-parallel soft magnetic side shield structures 318 at either side of the sensor stack 302. Each of the side shield structures 318 is separated from the sensor stack 302 and bottom shield 314 by a thin, non-magnetic, electrical insulation layer 320, which can be a material such as alumina, SixNy, $Ta_2O_5$, or MgO. Each of the side shields structures 318 includes first and second soft magnetic layers 322, 324 that are anti-parallel coupled with one another across an anti-parallel coupling layer 326. The soft magnetic layers 322, 324 are constructed of a material such as NiFe, NiFeCr, CoNiFe, or an alloy thereof that has a low magnetic coercivity and high magnetization saturation. The soft magnetic layers 322, 324 can be constructed of the same materials or can be constructed of different materials having differing magnetic moments (Bs). Each of the anti-parallel coupling layers 326 can include a non-magnetic layer such as Ru 328, sandwiched between layers of Co or CoFe 330 (such as for example CoFe/Ru/CoFe) to increase coupling strength. A seed layer 332 can be provided at the bottom of the shield structure 318 to provide a desired grain structure in the layers 322, 324, 326 formed there-above. The soft magnetic layers 322, 324 have magnetizations 334, 336 respectively that are oriented in opposite directions, each parallel with the air bearing surface.

Figure 4:
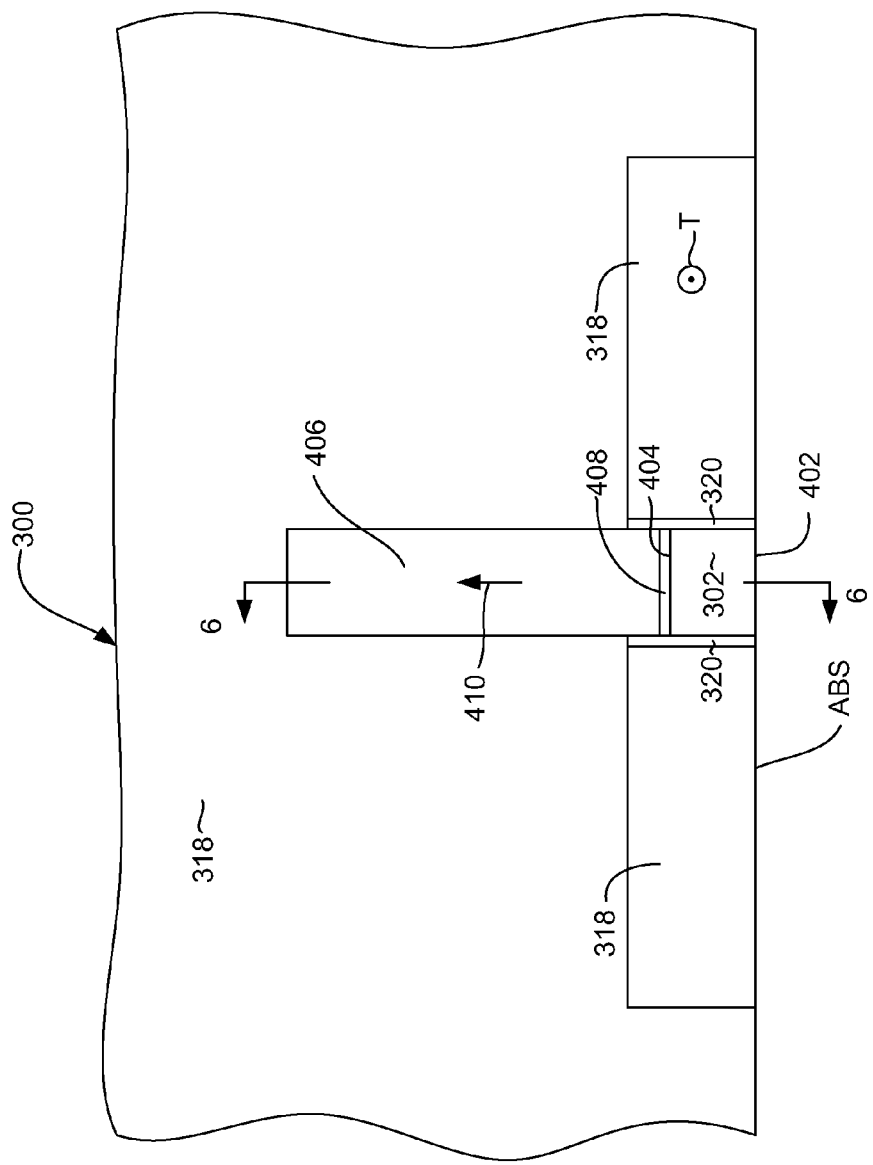
FIG. 4 is a top down view of the scissor type magnetic read sensor as seen from line 4-4 of FIG. 3.

FIG. 4 shows a top down, cross sectional view as seen from line 4-4 of FIG. 3. FIG. 4 shows the sensor stack 302 having a front edge 402 that extends to the air bearing surface (ABS) and has a back edge 404 opposite the front edge 402. The distance between the front edge 402 and back edge 404 defines the stripe height of the sensor stack 302. As can be seen in FIG. 4, the sensor 300 also includes a magnetic bias structure 406 that extends from the back edge 404 of the sensor stack 302 in a direction away from the ABS. The magnetic bias structure 406 can be constructed of a soft magnetic material having a relatively low coercivity. The term "soft" as used herein refers to a magnetic material that has a low magnetic coercivity that does not inherently maintain a magnetic state as a result of its grain structure as a hard, or high coercivity, magnetic material would do. This distinction will be further discussed herein below. The soft magnetic bias structure 406 is separated from the sensor stack 302 by a non-magnetic, electrically insulating layer 408 such as alumina, $Si_3N_4$, MgO, $Ta_2O_5$, or a combination thereof. The soft magnetic bias structure (the specific construction of which will be described in greater detail herein below) has a magnetization 410 oriented in a direction perpendicular to the ABS as shown. The effect of this magnetization and a mechanism for maintaining this magnetization 410 will be described in greater detail herein below.

Figure 5:
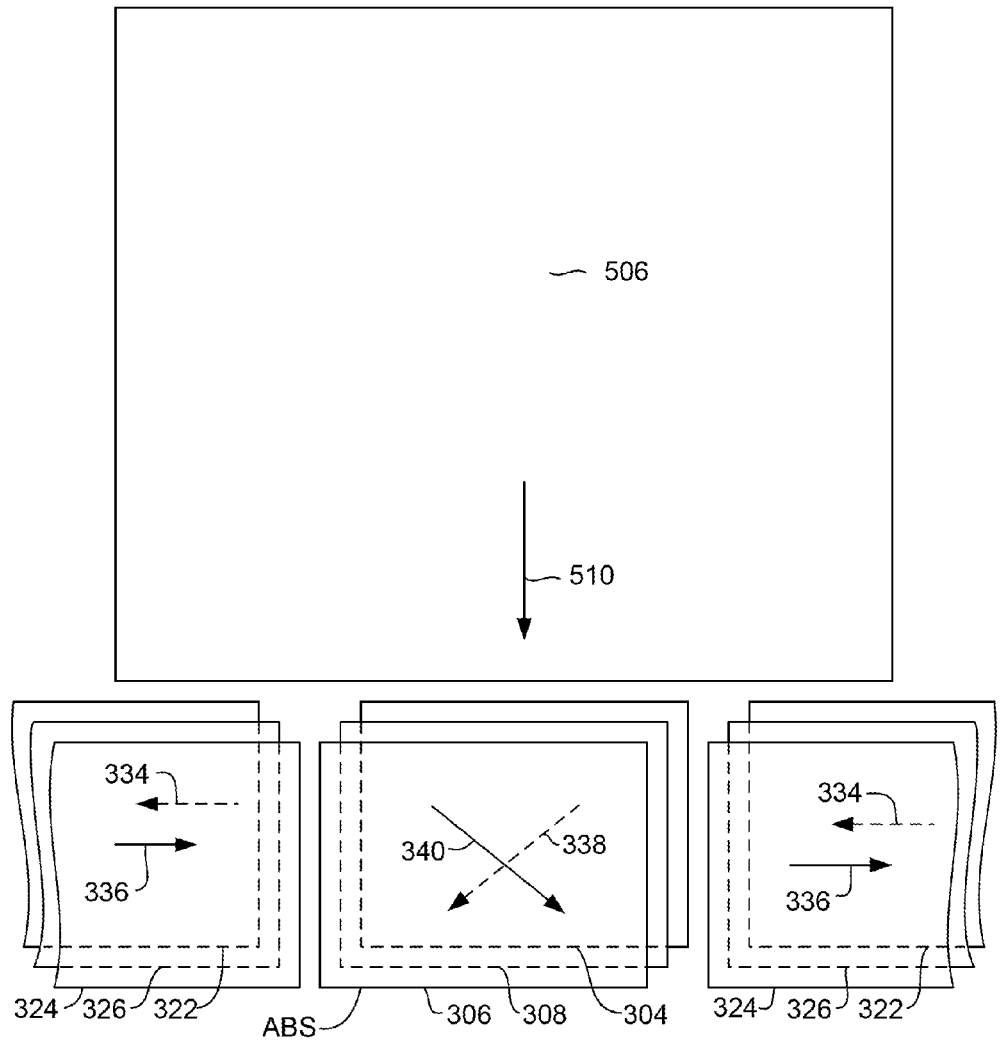
FIG. 5, is an exploded schematic view of a scissor type magnetic read sensor.

FIG. 5 shows an exploded schematic view of the sensor 300. As shown in FIG. 5, the free layers 304, 306 have magnetizations 338, 340 that are oriented generally orthogonal to one another. In the absence of a magnetic field from the magnetization 410 bias layer 406, the magnetizations 338, 340 would tend to align anti-parallel to one another in a direction parallel with the ABS, as a result of the anti-parallel coupling of the free layers 304, 306 and a magnetic anisotropy in a direction parallel with the ABS.

However, the presence of the magnetic field from the magnetization 410 of the bias structure 406 causes the magnetizations 338, 340 rotate so that they are generally orthogonal as shown. However, the magnetizations 338, 340 can respond to a magnetic field by rotating in a scissoring fashion. While the bias layer rotates the magnetizations 338, 340 of the free layers 304, 306 in desired orthogonal directions, the magnetization 410 of the bias layer 406 does not prevent the magnetizations 338, 340 from flipping direction (e.g. magnetization 336 pointing to the right and 338 pointing to the left), which would render the sensor 300 incompatible with the signal processing circuitry and would, therefore, render the sensor 300 useless.

The magnetizations 334, 336 from the layers 322, 324 of the soft side shield structure 318 (FIG. 3) prevent this. As can be seen in FIG. 3, the magnetic layer 322 is aligned with the bottom free layer 304 and the upper magnetic layer 324 is aligned with the upper free layer 306. Therefore, the magnetization 334 tends to pull the magnetization 338 in one direction parallel with the ABS, whereas the magnetization 336 tends to pull the magnetization 340 in an opposite direction parallel to the ABS. This effectively prevents the magnetizations 338, 340 from flipping direction and greatly improves the reliability of the sensor. Although not shown, in another embodiment, the magnetic layers 322, 324 can be configured so that they are not aligned with one another but the thickness of each can be adjusted for optimal performance and stability.

Figure 6:
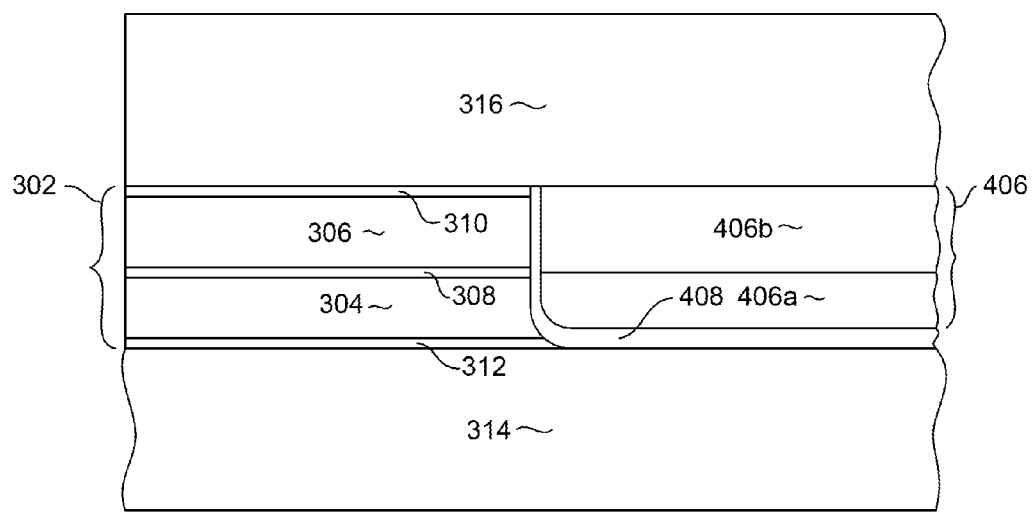
FIG. 6 is side, cross sectional view of the scissor type magnetic read sensor as seen from line 6-6 of FIG. 4.

FIG. 6 shows a side, cross sectional view of the sensor 300 wherein the unique structure of the bias layer structure 406 and its advantages is described in greater detail. As can be seen in FIG. 6, the sensor stack has a back edge that is sloped or rounded at the bottom, such that the bottom of the sensor stack 302 is further from the ABS than the top of the sensor stack 302. This means that the upper free layer 306 has a shorter stripe height than the lower free layer 304. In addition, the insulation layer 608 is thicker toward the bottom than it is at the top. This is a result of manufacturing processes used to form a sensor. In order to construct a sensor having a back edge bias structure, the layers of the sensor stack 302 are first deposited full film. Then, a mask is formed having an opening over the area where the hard bias is to be formed. An ion milling is performed to remove material exposed through the mask to form a pocket where the hard bias will be. This ion milling is preferably performed until the shield 314 is reached. The insulation layer 408 is then deposited, followed by the hard bias material 406. A chemical mechanical polishing process can then be performed to planarize the structure. However, the ion milling and deposition of the insulation 408 do not result in perfect vertical back edge walls, but in reality result in the sloping walls shown. Viable manufacturing methods for actually constructing a vertical back edge wall would result in electrical shunting due to excessive thinning of the insulation layer 408 and also due to re-deposition during ion milling.

If a standard single layer bias structure were used to form a back edge bias structure for biasing the magnetizations of the free layers 304, 306, this would result in inconsistent biasing, wherein the bottom free layer 304 would receive less effective biasing than the upper free layer 306. This is due to the extra stripe height of the bottom free layer 304 as compared with the upper free layer 306 as well as to the extra spacing between bias structure and the free layer 304 due to the increased thickness of the insulation layer 408.

The bias structure 406 of the present invention overcomes this obstacle by providing a varied magnetic biasing to compensate for these shape induced variations in bias between the free layers 304, 306. As shown in FIG. 6, the bias structure 406 is a bi-layer structure that includes a first bias layer 406a and a second bias layer 406b. The first layer 406a has a higher magnetic moment than that of the second magnetic layer 406b so that it provides a greater magnetic bias field than the second magnetic layer 406b does.

To this end, both the bottom layer 406a and top layer 406b can be constructed of NiFe, CoFe, CoNiFe, or their alloys with the bottom layer 406a having a higher magnetic moment than the top layer 406b. For example, the bottom layer 406a can be constructed of a Ni—Fe—Co alloy having higher moment than the upper layer 406B. The layers 406a and 406b can have a magnetic moment range of up to 2.2 Tesla. As an example, the bottom layer 406a can have a magnetic moment of 2.2-2.4 Tesla and the top layer 406b can have a magnetic moment of 1.8 to 2.0 Tesla.

Figure 7:
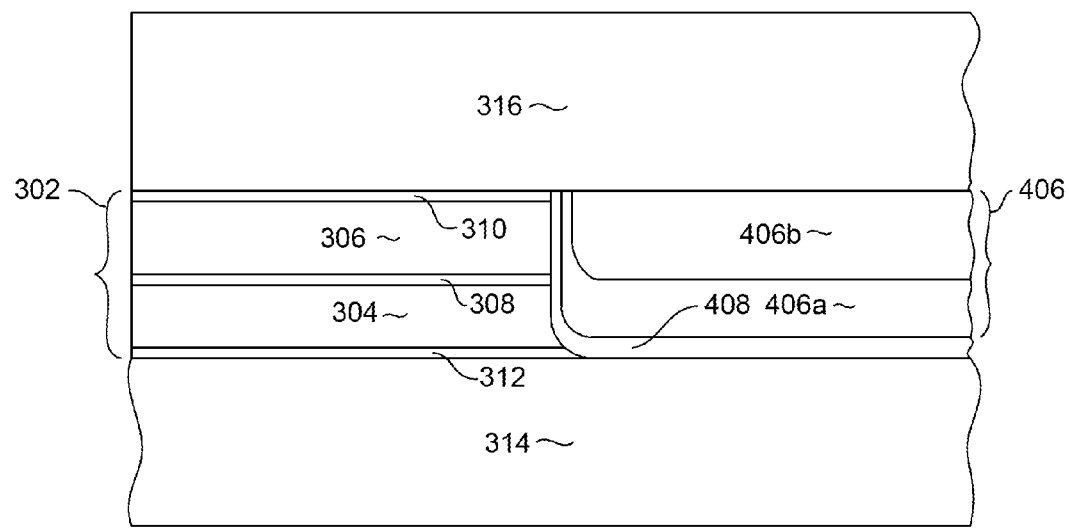
FIG. 7 is a side, cross sectional view of a scissor type magnetic read sensor according to another embodiment.

In FIG. 6 it can be seen boundary between the bottom layer 406a and top layer 406b is straight so that the bottom layer 406a remains below the top layer 406b all of the way to its front-most end adjacent to the sensor stack 302. In another possible embodiment, as shown in FIG. 7, the bottom layer 406a can be formed so that it extends upward at the frontmost end adjacent to the sensor stack 302. This can be achieved by controlling the manner in which the bottom layer 406a is deposited. In either of the embodiments of FIG. 6 or 7 the magnetic bias structure 406 can be a hard magnetic bias structure or a soft magnetic bias structure. That is, the layers 406a, 406b can be constructed of materials that are magnetically hard, high coercivity materials, or can be constructed of magnetically soft magnetic materials that have a lower magnetic coercivity.

While the above embodiments describe the bias structure 406 as being formed of discreet layers 406a, 406b, each having a different magnetic moment, the bias structure could also be formed to have a gradient magnetic moment. That is, the bias structure 406 could be formed with a magnetic layer having a magnetic moment that gradually varies so that it has a higher magnetic moment at the bottom and a lower magnetic moment at the top, with the magnetic moment gradually varying from bottom to top. In addition, the bias structure 406 could be formed with discreet layers having different magnetic moments, but with more than two discreet layers.

Figure 8:
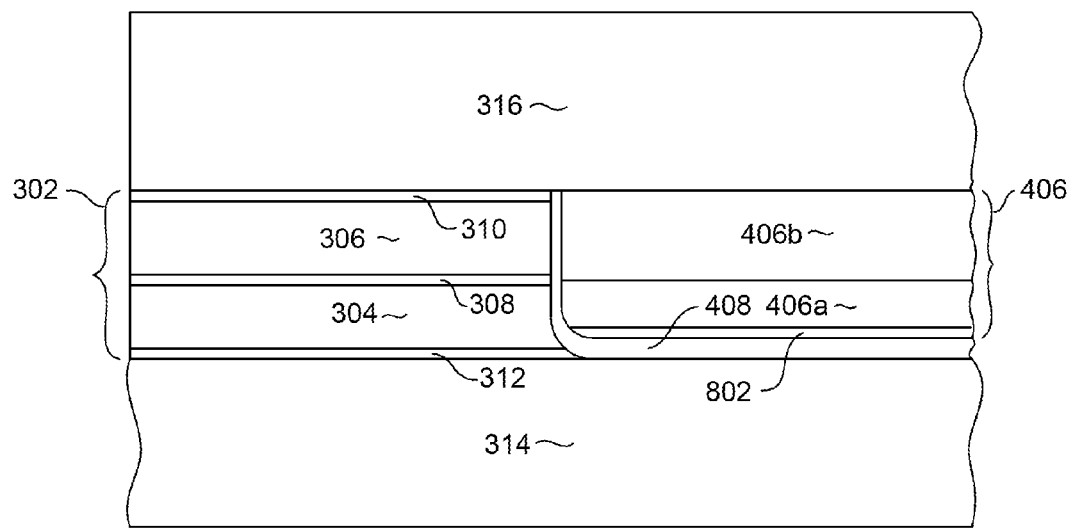
FIG. 8 is a side, cross sectional view of a scissor type magnetic read sensor according to another embodiment.

With reference to FIG. 8, in another embodiment, a layer of antiferromagnetic material (AFM layer) 802 such as IrMn or PtMn can be exchange coupled with one of the magnetic layers 406a, 406b to pin the magnetization of the magnetic bias structure 406 in a desired direction. The provision of this AFM layer 802 can be especially useful if the layers 406a, 406b are lower coercivity, soft magnetic materials. The AFM layer 802 can be provided at the bottom of the bias structure 406 as shown or could be located at the top of the bias structure 406 as well. In addition, although only two layers 406a, 406b are shown, a bias structure could also be constructed having more than two such magnetic layers with differing magnetic moments.

Figure 9:
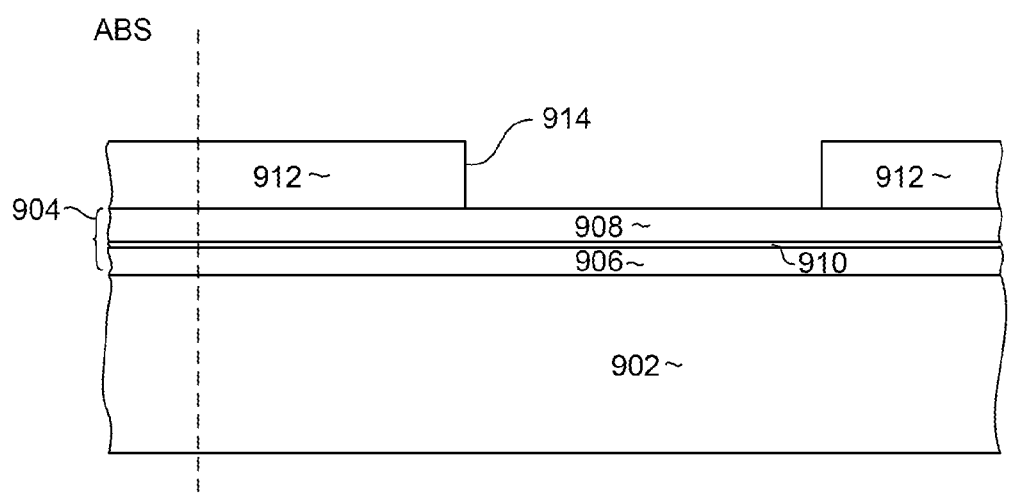
FIGS. 9-15 show a magnetic sensor in various intermediate stages of manufacture, illustrating a method for manufacturing a scissor type magnetic sensor according to an embodiment of the invention.
Figure 10:
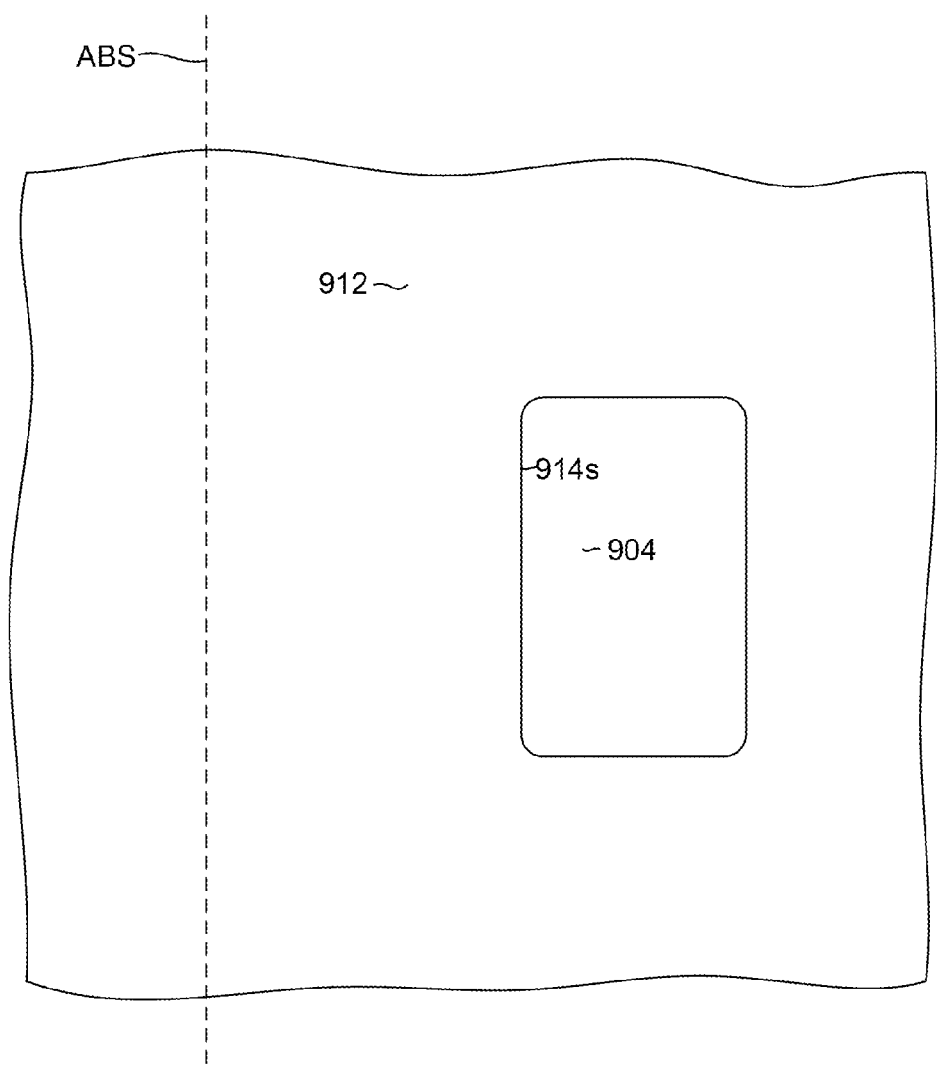
Figure 11:
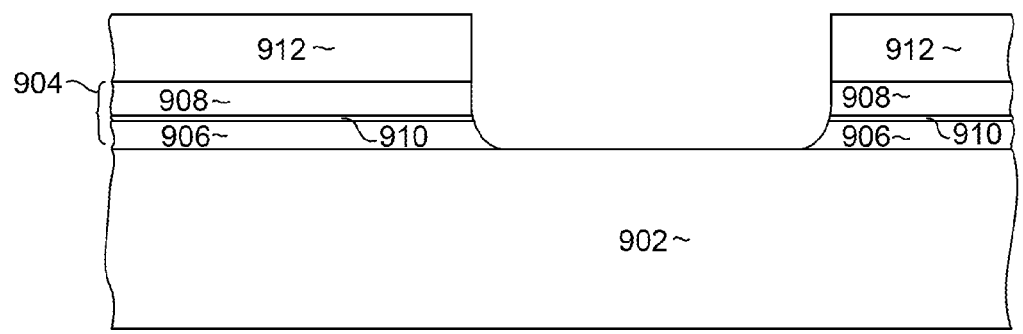

With reference to FIGS. 9-15, a method for manufacturing a scissor type magnetic read sensor having a multi-layer back edge bias structure is described. With particular reference to FIG. 9 a bottom magnetic, electrically insulating shield 902 is formed having a flat upper surface. A series of sensor layers 904 is formed over the shield 902. The series of sensor layers 904 can include a bottom magnetic free layer 906, an upper magnetic free layer 908 and a non-magnetic barrier or spacer layer 910 sandwiched between the magnetic free layers 906, 908. A mask 912 is formed over the series of sensor layers 904. The configuration of the mask 912 can be seen more clearly with reference to FIG. 10, which is a top down view showing that the mask 912 is configured with an opening 914. The opening 914 is located a desired distance from an air bearing surface plane ABS and is configured to define a sensor stripe height as measured from the ABS plane and also to define a stripe height of a back edge bias structure, as will be seen. With the mask 912 formed, an ion milling is performed to remove portions of the sensor material 904 that are not protected by the mask 912, leaving a structure as shown in FIG. 11. As can be seen in FIG. 11, this result in a pocket being formed in the sensor material 904, the pocket having rounded edges.

Figure 12:
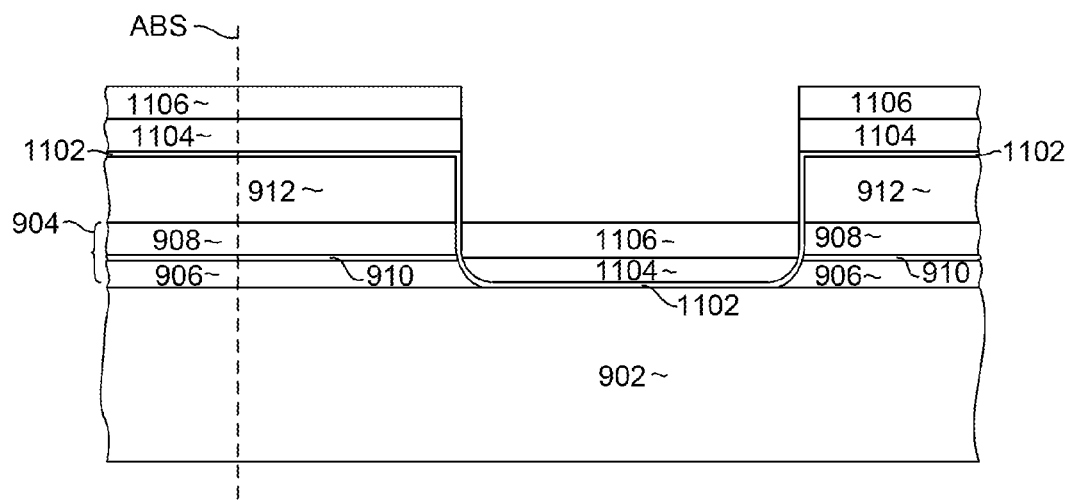

Then, with reference to FIG. 12, an insulation layer 1102 is deposited (preferably by a conformal deposition process such as atomic layer deposition. This is followed by the deposition of a first magnetic layer 1104 over the insulation layer 1102, followed by the deposition of a second magnetic layer 1106 over the first magnetic layer 1104. In other embodiments multiple magnetic layers (more than two) can be deposited. These layers 1104, 1106 are magnetic materials that will form a back edge bias structure wherein the individual layers 1104, 1106 provide different magnetic bias fields in order to compensate for the curved shape of the back edge of the sensor layers 904. In the embodiment shown in FIG. 12 the deposition of the magnetic layers 1104, 1106 is performed in such a manner that they are deposited primarily on horizontal surfaces with little or no deposition on side walls. This results in the junction between the layers 1104, 1106 being substantially flat as shown, with both the top and bottom magnetic layers 1104, 1106 extending to the insulation layer 1104 at the back edge of the sensor layers 904.

Figure 13:
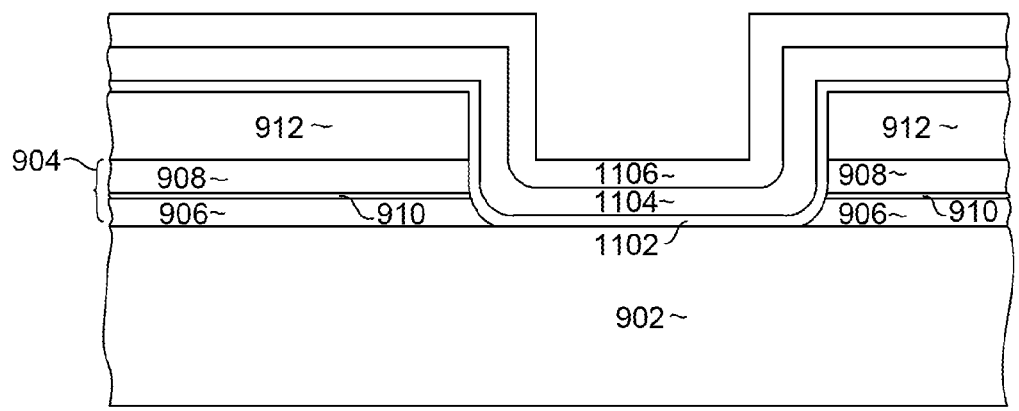

In another embodiment, as shown in FIG. 13, the deposition of the layers 1104, 1106 can be performed by a more conformal deposition method such as atomic layer deposition, which results in the bottom magnetic layer 1104 extending upward at the sides so as to separate the upper layer 1106 from the insulation layer 1102 at the back edge of the sensor layers 904.

In order to form a sensor such as that described above with reference to FIG. 8, a layer of anti-ferromagnetic material (not shown in FIGS. 12 and 13) such as IrMn or PtMn can be deposited prior to deposition of the magnetic layers 1104, 1106. This layer of anti-ferromagnetic material could be used to maintain the magnetization of the magnetic layers 1104, 1106 for improved magnetic biasing.

Figure 14:
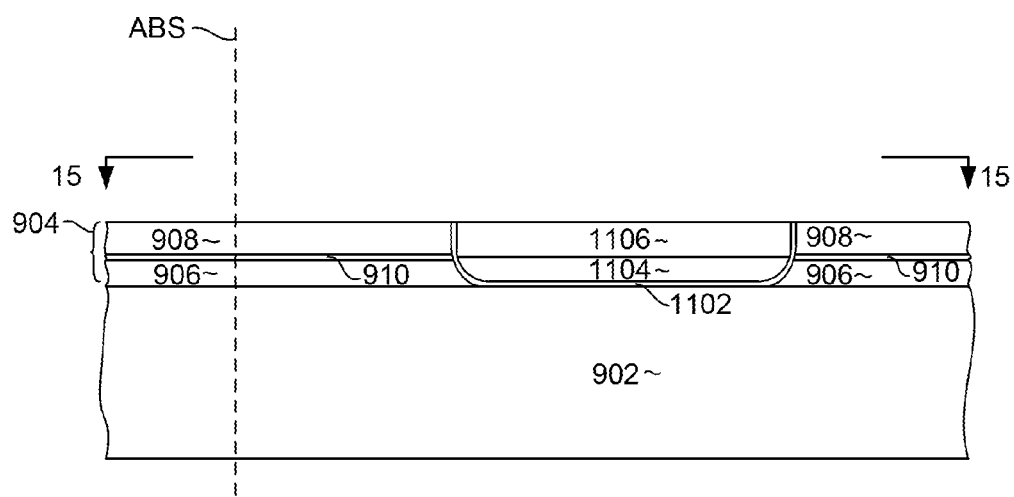
Figure 15:
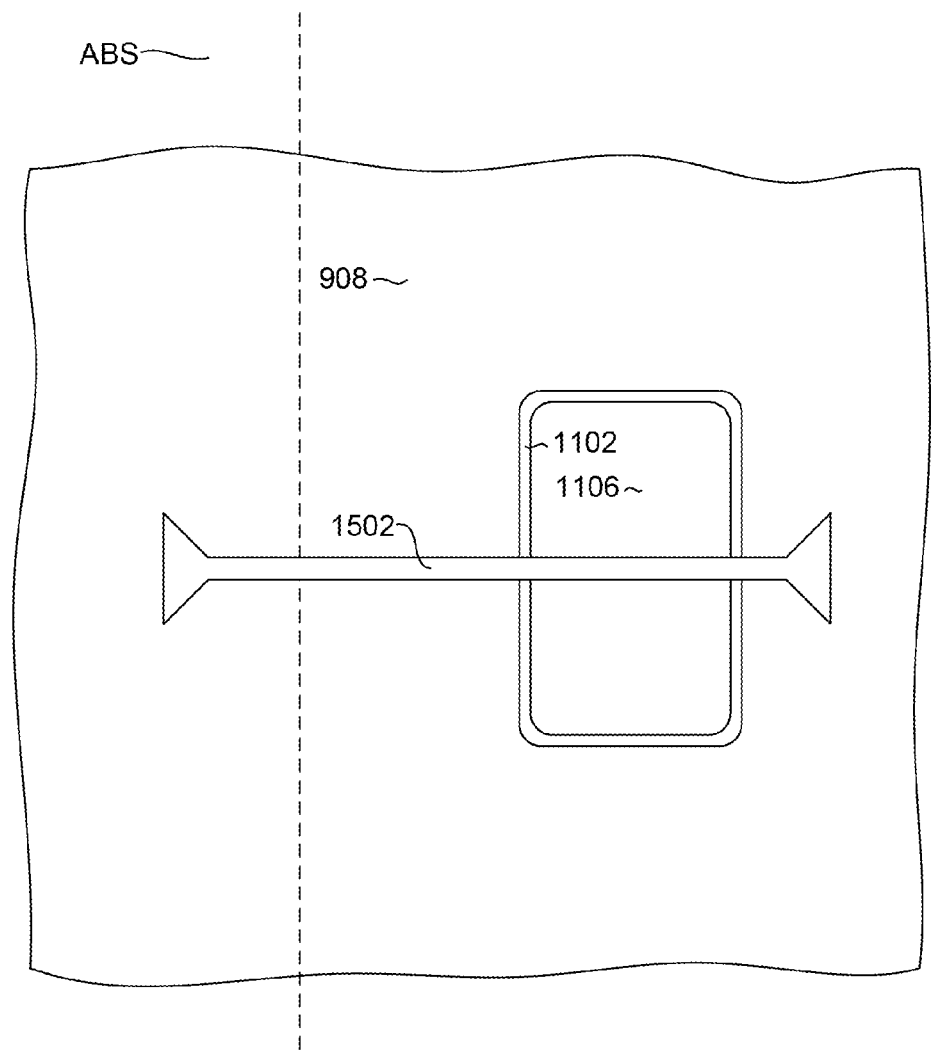

A planarization process such as chemical mechanical polishing can then be performed, leaving a structure such as that shown in FIG. 14. Then, with reference to FIG. 15, which shows a top down view as seen from line 15-15 of FIG. 14, a track width defining mask 1502 can be formed. Thereafter, a second ion milling can be performed to remove material not protected by the mask in order to define a sensor track-width. After defining the track-width, a side shield structure can be formed. Alternatively a dielectric fill layer can be deposited in lieu of forming a magnetic side shield structure, depending upon design considerations. It should be pointed out, while the above described process defined the sensor stripe height first followed by the track-width, it would also be possible to reverse the order so that the sensor track-width is defined first, followed by the stripe height and back edge bias structure. In that case, the back edge bias structure could be formed to extend beyond the sides of the sensor stack.

While various embodiments have been described above, it should be understood that they have been presented by way of example only and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:
1. A magnetic sensor, comprising:
a sensor stack; and
a magnetic bias structure formed adjacent to the sensor stack, the bias structure having a magnetic moment that varies with location within the bias structure;
wherein the magnetic bias structure comprises a first magnetic layer and a second magnetic layer formed over the first magnetic layer and wherein, the first magnetic layer having a greater magnetic moment than the second magnetic layer and wherein the difference between the magnetic moment of the first and second magnetic layers is not greater than 2.2 Tesla;
wherein the magnetic bias structure is separated from the back edge of the sensor stack by a non-magnetic, electrically insulating layer; and wherein the first magnetic layer extends up along the non-magnetic, electrically insulating layer so as to separate the second magnetic layer from the non-magnetic, electrically insulating layer.

2. The magnetic sensor as in claim 1, wherein the bias structure includes a first magnetic layer and a second magnetic layer formed over the first magnetic layer, the first magnetic layer having a higher magnetic moment than the second magnetic layer.

3. The magnetic sensor as in claim 1 wherein the magnetic bias structure includes a plurality of magnetic layers having differing magnetic moments.

4. The magnetic sensor as in claim 1 wherein the magnetic bias structure further comprises a first magnetic layer having a magnetic moment of 2.2-2.4 Tesla and a second magnetic layer formed over the first magnetic layer and having a magnetic moment of 1.8-2.0 Tesla.

5. The magnetic sensor as in claim 1 wherein the sensor stack has a back edge located opposite an air bearing surface and wherein the bias structure is a back edge bias structure located adjacent to the back edge of the sensor stack.

6. A magnetic sensor, comprising:
a scissor type sensor stack having a front edge located at an air bearing surface and a back edge opposite the air bearing surface and having first and second magnetic free layers that are anti-parallel coupled across a non-magnetic layer;
a non-magnetic, electrically insulating layer formed on the back edge of the scissor type sensor stack; and
a back edge magnetic bias structure separated from the back edge of the scissor type sensor stack by the non-magnetic, dielectric layer, the back edge magnetic bias structure having a magnetic moment adjacent to the first magnetic free layer that is greater than that adjacent to the second magnetic free layer.

7. The magnetic sensor as in claim 6, wherein the back edge magnetic bias structure includes a first magnetic layer and a second magnetic layer formed over the first magnetic layer, the first magnetic layer having a higher magnetic moment than the second magnetic layer.

8. The magnetic sensor as in claim 6, wherein the back edge magnetic bias structure includes a plurality of magnetic layers having differing magnetic moments.

9. The magnetic sensor as in claim 6, wherein the back edge magnetic bias structure has a gradient magnetic moment that varies in a thickness direction of the magnetic bias structure.

10. The magnetic sensor as in claim 6, wherein the back edge magnetic bias structure further comprises a first magnetic layer and a second magnetic layer and wherein, the first magnetic layer having a greater magnetic moment than the second magnetic layer and wherein the difference between the magnetic moment of the first and second magnetic layers is not greater than 2.2 Tesla.

11. The magnetic sensor as in claim 6, wherein the back edge magnetic bias structure further comprises a first magnetic layer having a magnetic moment of 2.2-2.4 Tesla and a second magnetic layer formed over the first magnetic layer and having a magnetic moment of 1.8-2.0 Tesla.

12. The magnetic sensor as in claim 6, wherein the back edge magnetic bias structure includes a first magnetic layer and a second magnetic layer formed over the first magnetic layer formed over the second magnetic layer, both the first and second magnetic layers comprising NiFe, CoFe, CoNiFe or alloys thereof.

13. A magnetic data recording system, comprising:
a housing;
a magnetic media held within the housing;
a magnetic sensor; held within the housing so as to move adjacent to a surface of the magnetic media, the magnetic sensor further comprising:
a sensor stack; and
a magnetic bias structure formed adjacent to the sensor stack, the bias structure having a magnetic moment that varies with location within the bias structure;
wherein the magnetic bias structure comprises a first magnetic layer and a second magnetic layer formed over the first magnetic layer and wherein, the first magnetic layer having a greater magnetic moment than the second magnetic layer and wherein the difference between the magnetic moment of the first and second magnetic layers is not greater than 2.2 Tesla;
wherein the magnetic bias structure is separated from the back edge of the sensor stack by a non-magnetic, electrically insulating layer; and
wherein the first magnetic layer extends up along the non-magnetic, electrically insulating layer so as to separate the second magnetic layer from the non-magnetic, electrically insulating layer.

14. The magnetic sensor as in claim 13, wherein the bias structure includes a first magnetic layer and a second magnetic layer formed over the first magnetic layer, the first magnetic layer having a higher magnetic moment than the second magnetic layer.

\* \* \* \* \*